(12) United States Patent
Scheffelin et al.

(10) Patent No.: US 6,789,878 B2
(45) Date of Patent: Sep. 14, 2004

(54) FLUID MANIFOLD FOR PRINTHEAD ASSEMBLY

(75) Inventors: Joseph E. Scheffelin, Poway, CA (US); Paul Mark Haines, Lebanon, OR (US); Michael Martin, Dana Point, CA (US); Melissa D. Boyd, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/283,860

(22) Filed: Oct. 30, 2002

(65) Prior Publication Data

US 2003/0052944 A1 Mar. 20, 2003

Related U.S. Application Data

(63) Continuation-in-part of application No. 10/194,843, filed on Jul. 11, 2002, now Pat. No. 6,679,596, which is a continuation of application No. 09/972,648, filed on Oct. 5, 2001, now Pat. No. 6,435,653, which is a continuation of application No. 09/216,606, filed on Dec. 17, 1998, now Pat. No. 6,322,206, which is a continuation-in-part of application No. 08/959,376, filed on Oct. 28, 1997, now Pat. No. 6,123,410.

(51) Int. Cl.$^7$ .............................................. B41J 2/155
(52) U.S. Cl. ...................................................... 347/42
(58) Field of Search ............................ 347/65, 40, 71, 347/85, 42, 49

(56) References Cited

U.S. PATENT DOCUMENTS

| | | |
|---|---|---|
| 5,016,023 A | 5/1991 | Chan et al. |
| 5,057,854 A | 10/1991 | Pond et al. |
| 5,079,189 A | 1/1992 | Drake et al. |
| 5,098,503 A | 3/1992 | Drake |
| 5,160,945 A | 11/1992 | Drake |
| 5,469,199 A | 11/1995 | Allen et al. |
| 5,489,930 A | 2/1996 | Anderson |
| 5,565,900 A | 10/1996 | Cowger et al. |
| 5,696,544 A | 12/1997 | Komuro |
| 5,742,305 A | 4/1998 | Hackleman |
| 5,939,206 A | 8/1999 | Kneezel et al. |
| 6,123,410 A | 9/2000 | Beerling et al. |
| 6,250,738 B1 | 6/2001 | Waller et al. |
| 6,322,206 B1 | 11/2001 | Boyd et al. |
| 6,341,845 B1 | 1/2002 | Scheffelin et al. |
| 6,343,857 B1 | 2/2002 | Cowger |
| 6,431,683 B1 | 8/2002 | Ho et al. |
| 6,435,653 B1 | 8/2002 | Boyd et al. |

OTHER PUBLICATIONS

Ross R. Allen, "Inkjet Printing with Large Pagewide Arrays: Issues and Challenges", Recent Progress in Ink Jet Technologies II, pp. 114–120; originally published in "12th International Congress on Advances in Non–Impact Printing Technologies Proc.", p. 43, 1996.

*Primary Examiner*—Thinh Nguyen

(57) ABSTRACT

A printhead assembly includes a carrier having a fluid manifold defined therein, and a plurality of printhead dies each mounted on the carrier and including a first nozzle set and a second nozzle set. The fluid manifold includes a first chamber and a second chamber such that the first nozzle set of each of the printhead dies communicates with the first chamber of the fluid manifold and the second nozzle set of each of the printhead dies communicates with the second chamber of the fluid manifold.

49 Claims, 7 Drawing Sheets

FLUID MANIFOLD FOR PRINTHEAD ASSEMBLY

CROSS-REFERENCE TO RELATED APPLICATIONS

This application is a Continuation-in-Part of U.S. patent application Ser. No. 10/194,843, filed on Jul. 11, 2002 now U.S. Pat. No. 6,679,596, which is a Continuation of U.S. patent application Ser. No. 09/972,648, filed on Oct. 5, 2001, now U.S. Pat. No. 6,435,653, which is a Continuation of U.S. patent application Ser. No. 09/216,606, filed on Dec. 17, 1998, now U.S. Pat. No. 6,322,206, which is a Continuation-in-Part of U.S. patent application Ser. No. 08/959,376, filed on Oct. 28, 1997, now U.S. Pat. No. 6,123,410, each assigned to the assignee of the present invention and incorporated herein by reference.

THE FIELD OF THE INVENTION

The present invention relates generally to inkjet printheads, and more particularly to a fluid manifold for an inkjet printhead assembly.

BACKGROUND OF THE INVENTION

A conventional inkjet printing system includes a printhead, an ink supply which supplies liquid ink to the printhead, and an electronic controller which controls the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single carrier. As such, a number of nozzles and, therefore, an overall number of ink drops which can be ejected per second is increased. Since the overall number of ink drops which can be ejected per second is increased, printing speed can be increased with the wide-array inkjet printing system.

When mounting a plurality of printhead dies on a single carrier, the single carrier performs several functions including fluid and electrical routing as well as printhead die support. More specifically, the single carrier accommodates communication of ink between the ink supply and each of the printhead dies, accommodates communication of electrical signals between the electronic controller and each of the printhead dies, and provides a stable support for each of the printhead dies. Unfortunately, effectively combining these functions is difficult.

Accordingly, it is desirable for a carrier which provides support for a plurality of printhead dies while accommodating fluidic and electrical routing to the printhead dies.

SUMMARY OF THE INVENTION

A printhead assembly includes a carrier having a fluid manifold defined therein, and a plurality of printhead dies each mounted on the carrier and including a first nozzle set and a second nozzle set. The fluid manifold includes a first chamber and a second chamber such that the first nozzle set of each of the printhead dies communicates with the first chamber of the fluid manifold and the second nozzle set of each of the printhead dies communicates with the second chamber of the fluid manifold.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
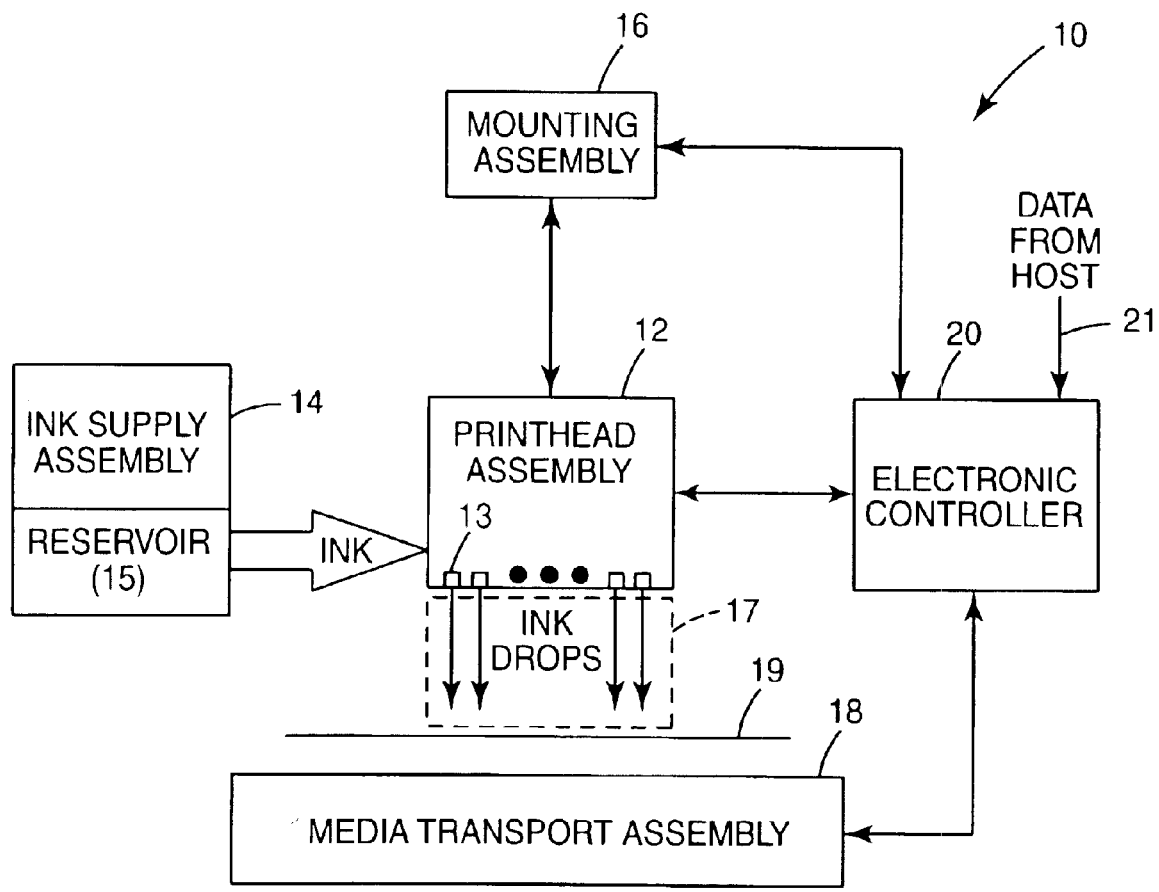
FIG. 1 is a block diagram illustrating one embodiment of an inkjet printing system.

FIG. 1 illustrates one embodiment of an inkjet printing system 10. Inkjet printing system 10 includes an inkjet printhead assembly 12, an ink supply assembly 14, a mounting assembly 16, a media transport assembly 18, and an electronic controller 20. Inkjet printhead assembly 12 is formed according to an embodiment of the present invention, and includes one or more printheads which eject drops of ink or fluid through a plurality of orifices or nozzles 13.

In one embodiment, the drops of ink are directed toward a medium, such as print medium 19, so as to print onto print medium 19. Print medium 19 includes any type of suitable sheet material, such as paper, card stock, transparencies, Mylar, and the like. Typically, nozzles 13 are arranged in one or more columns or arrays such that properly sequenced ejection of ink from nozzles 13 causes, in one embodiment, characters, symbols, and/or other graphics or images to be printed upon print medium 19 as inkjet printhead assembly 12 and print medium 19 are moved relative to each other.

Ink supply assembly 14 supplies ink to inkjet printhead assembly 12 and includes a reservoir 15 for storing ink. As such, in one embodiment, ink flows from reservoir 15 to inkjet printhead assembly 12. In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly and mounting assembly 16 includes a carriage for moving inkjet printhead assembly 12 relative to media transport assembly 18. In another embodiment, inkjet printhead assembly 12 is a non-scanning type printhead assembly and mounting assembly 16 fixes inkjet printhead assembly 12 at a prescribed position relative to media transport assembly 18.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or-file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops is determined by the print job commands and/or command parameters. In one embodiment, logic and drive circuitry forming a portion of electronic controller 20 is located on inkjet printhead assembly 12. In another embodiment, logic and drive circuitry is located off inkjet printhead assembly 12.

Figure 2:
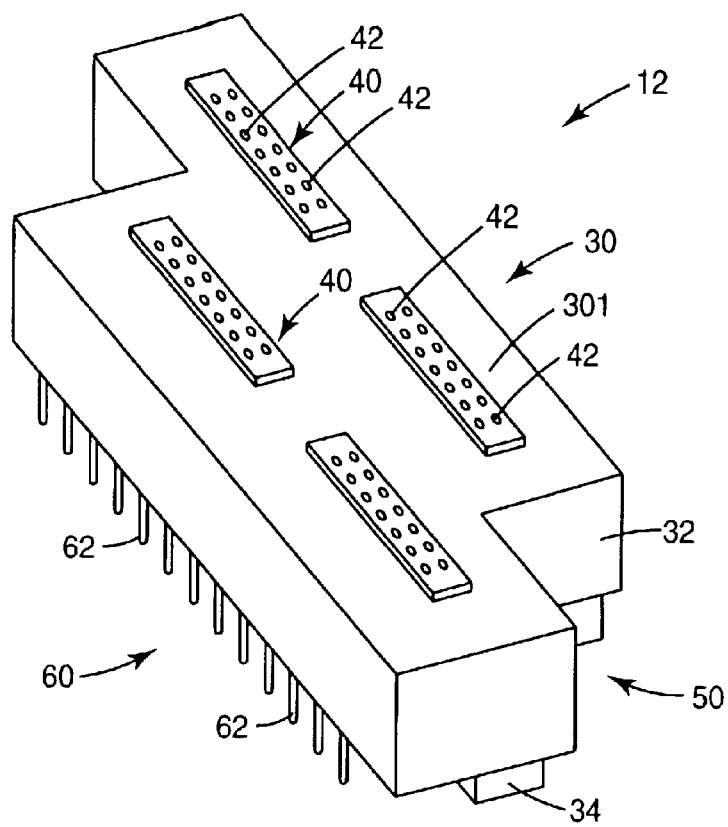
FIG. 2 is a top perspective view illustrating one embodiment of an inkjet printhead assembly.
Figure 3:
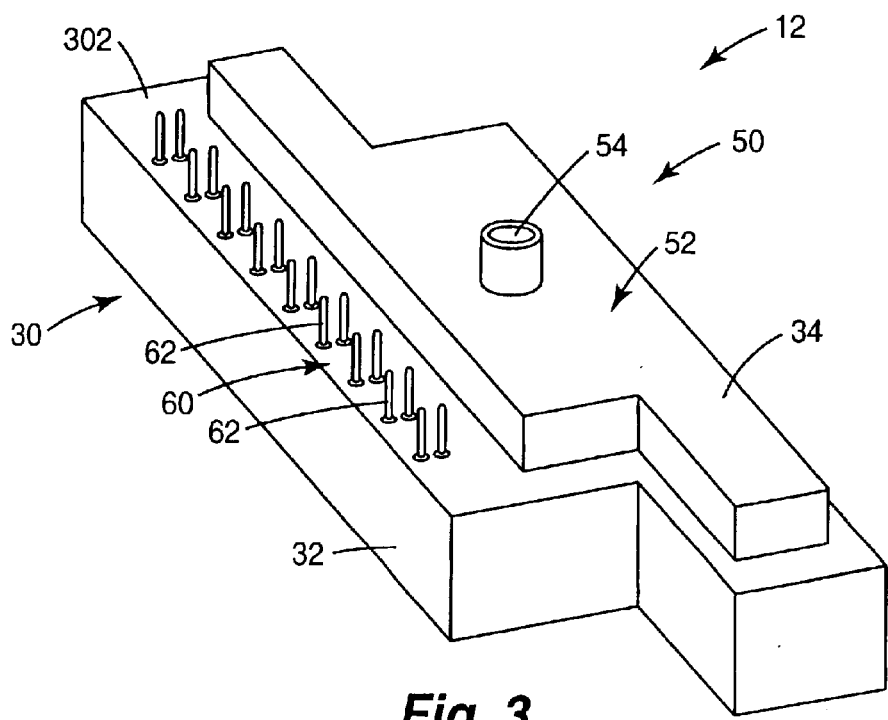
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 has an exposed surface or first face 301 and an exposed surface or second face 302 which is opposite of and oriented substantially parallel with first face 301. Carrier 30 serves to carry or provide mechanical support for printhead dies 40. In addition, carrier 30 accommodates fluidic communication between ink supply assembly 14 and printhead dies 40 via ink delivery system 50 and accommodates electrical communication between electronic controller 20 and printhead dies 40 via electronic interface system 60.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, inkjet printhead assembly 12 may span a nominal page width or a width shorter or longer than nominal page width. While four printhead dies 40 are illustrated as being mounted on carrier 30, the number of printhead dies 40 mounted on carrier 30 may vary.

In one embodiment, a plurality of inkjet printhead assemblies 12 are mounted in an end-to-end manner. In one embodiment, to provide for at least one printhead die 40 of one inkjet printhead assembly 12 overlapping at least one printhead die 40 of an adjacent inkjet printhead assembly 12, carrier 30 has a staggered or stair-step profile. While carrier 30 is illustrated as having a stair-step profile, it is within the scope of the present invention for carrier 30 to have other profiles including a substantially rectangular profile.

Ink delivery system 50 fluidically couples ink supply assembly 14 with printhead dies 40. In one embodiment, ink delivery system 50 includes a fluid manifold 52 and a port 54. Fluid manifold 52 is formed in carrier 30 and distributes ink through carrier 30 to each printhead die 40. Port 54 communicates with fluid manifold 52 and provides an inlet for ink supplied by ink supply assembly 14.

Electronic interface system 60 electrically couples electronic controller 20 with printhead dies 40. In one embodiment, electronic interface system 60 includes a plurality of electrical contacts 62 which form input/output (I/O) contacts for electronic interface system 60. As such, electrical contacts 62 provide points for communicating electrical signals between electronic controller 20 and inkjet printhead assembly 12. Examples of electrical contacts 62 include I/O pins which engage corresponding I/O receptacles electrically coupled to electronic controller 20 and I/O contact pads or fingers which mechanically or inductively contact corresponding electrical nodes electrically coupled to electronic controller 20. Although electrical contacts 62 are illustrated as being provided on second face 302 of carrier 30, it is within the scope of the present invention for electrical contacts 62 to be provided on other sides of carrier 30.

Figure 4:
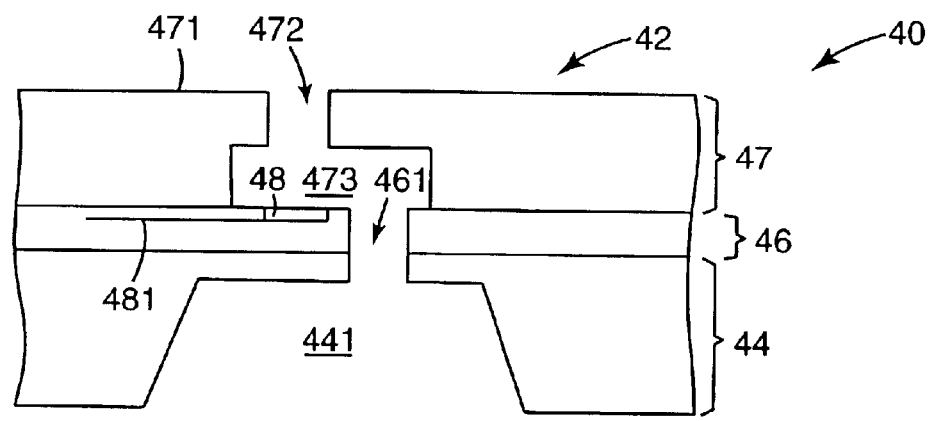
FIG. 4 is a schematic cross-sectional view illustrating portions of one embodiment of a printhead die.

As illustrated in the embodiment of FIGS. 2 and 4, each printhead die 40 includes an array of drop ejecting elements 42. Drop ejecting elements 42 are formed on a substrate 44 which has an ink or fluid feed slot 441 formed therein. As such, fluid feed slot 441 provides a supply of ink or fluid to drop ejecting elements 42. Substrate 44 is formed, for example, of silicon, glass, or a stable polymer.

In one embodiment, each drop ejecting element 42 includes a thin-film structure 46 and an orifice layer 47. Thin-film structure 46 includes a firing resistor 48 and has an ink or fluid feed channel 461 formed therein which communicates with fluid feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and fluid feed channel 461 of thin-film structure 46. Firing resistor 48 is positioned within nozzle chamber 473 and includes leads 481 which electrically couple firing resistor 48 to a drive signal and ground.

Thin-film structure 46 is formed, for example, by one or more passivation or insulation layers of silicon dioxide, silicon carbide, silicon nitride, tantalum, poly-silicon glass, or other suitable material. In one embodiment, thin-film structure 46 also includes a conductive layer which defines firing resistor 48 and leads 481. The conductive layer is formed, for example, by aluminum, gold, tantalum, tantalum-aluminum, or other metal or metal alloy.

In one embodiment, during operation, ink or fluid flows from fluid feed slot 441 to nozzle chamber 473 via fluid feed channel 461. Nozzle opening 472 is operatively associated with firing resistor 48 such that droplets of ink or fluid are ejected from nozzle chamber 473 through nozzle opening 472 (e.g., normal to the plane of firing resistor 48) and toward a medium upon energization of firing resistor 48.

Example embodiments of printhead dies 40 include a thermal printhead, as described above, a piezoelectric printhead, a flex-tensional printhead, or any, other type of fluid ejection device known in the art. In one embodiment, printhead dies 40 are fully integrated thermal inkjet printheads.

Figure 5:
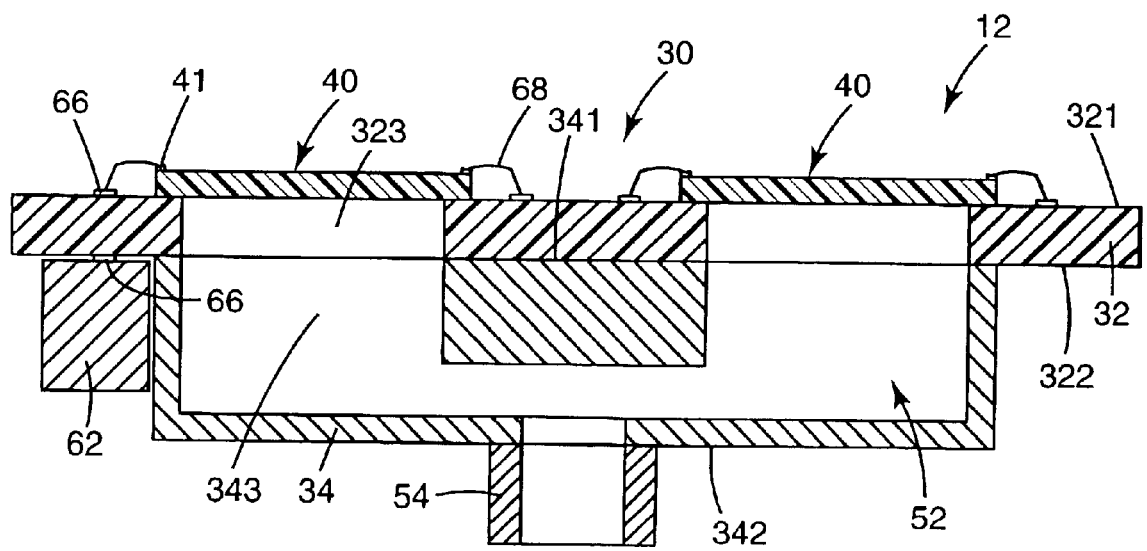
FIG. 5 is a schematic cross-sectional view illustrating one embodiment of an inkjet printhead assembly.

Referring to the embodiment of FIGS. 2, 3, and 5, carrier 30 includes a substrate 32 and a substructure 34. Substrate 32 and substructure 34 provide and/or accommodate mechanical, electrical, and fluidic functions of inkjet printhead assembly 12. More specifically, substrate 32 provides mechanical support for printhead dies 40, accommodates fluidic communication between ink supply assembly 14 and printhead dies 40 via ink delivery system 50, and provides electrical connection between and among printhead dies 40 and electronic controller 20 via electronic interface system 60. Substructure 34 provides mechanical support for substrate 32, accommodates fluidic communication between ink supply assembly 14 and printhead dies 40 via ink delivery system 50, and accommodates electrical connection between printhead dies 40 and electronic controller 20 via electronic interface system 60.

Substrate 32 has a first side 321 and a second side 322 which is opposite first side 321, and substructure 34 has a first side 341 and a second side 342 which is opposite first side 341. In one embodiment, printhead dies 40 are mounted on first side 321 of substrate 32 and substructure 34 is disposed on second side 322 of substrate 32. As such, first side 341 of substructure 34 contacts and is joined to second side 322 of substrate 32.

For transferring ink between ink supply assembly 14 and printhead dies 40, substrate 32 and substructure 34 each have a plurality of ink or fluid passages 323 and 343, respectively, formed therein. Fluid passages 323 extend through substrate 32 and provide a through-channel or through-opening for delivery of ink to printhead dies 40 and, more specifically, fluid feed slot 441 of substrate 44 (FIG. 4). Fluid passages 343 extend through substructure 34 and provide a through-channel or through-opening for delivery of ink to fluid passages 323 of substrate 32. As such, fluid passages 323 and 343 form a portion of ink delivery system 50. Although only one fluid passage 323 is shown for a given printhead die 40, there may be additional fluid passages to the same printhead die, for example, to provide ink of respective differing colors.

In one embodiment, substructure 34 is formed of a non-ceramic material such as plastic. Substructure 34 is formed, for example, of a high performance plastic including a fiber reinforced resin such as polyphenylene sulfide (PPS) or a polystyrene (PS) modified polyphenylene oxide (PPO) or polyphenylene ether (PPE) blend such as NORYL®. It is, however, within the scope of the present invention for substructure 34 to be formed of silicon, stainless steel, or other suitable material or combination of materials. Preferably, substructure 34 is chemically compatible with liquid ink so as to accommodate fluidic routing.

Figure 6:
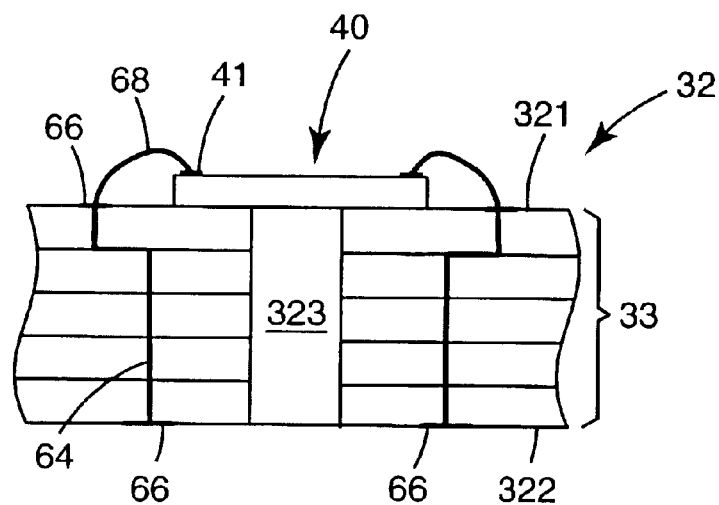
FIG. 6 is a schematic cross-sectional view illustrating one embodiment of a portion of a substrate for an inkjet printhead assembly.

For transferring electrical signals between electronic controller 20 and printhead dies 40, electronic interface system 60 includes a plurality of conductive paths 64 extending through substrate 32, as illustrated in FIG. 6. More specifically, substrate 32 includes conductive paths 64 which pass through and terminate at exposed surfaces of substrate 32. In one embodiment, conductive paths 64 include electrical contact pads 66 at terminal ends thereof which form, for example, I/O bond pads on substrate 32. Conductive paths 64, therefore, terminate at and provide electrical coupling between electrical contact pads 66.

Electrical contact pads 66 provide points for electrical connection to substrate 32 and, more specifically, conductive paths 64. Electrical connection is established, for example, via electrical connectors or contacts 62, such as I/O pins or spring fingers, wire bonds, electrical nodes, and/or other suitable electrical connectors. In one embodiment, printhead dies 40 include electrical contacts 41 which form I/O bond pads. As such, electronic interface system 60 includes electrical connectors, for example, wire bond leads 68, which electrically couple electrical contact pads 66 with electrical contacts 41 of printhead dies 40.

Conductive paths 64 transfer electrical signals between electronic controller 20 and printhead dies 40. More specifically, conductive paths 64 define transfer paths for power, ground, and data among and/or between printhead dies 40 and electrical controller 20. In one embodiment, data includes print data and non-print data.

In one embodiment, as illustrated in FIG. 6, substrate 32 includes a plurality of layers 33 each formed of a ceramic material. As such, substrate 32 includes circuit patterns which pierce layers 33 to form conductive paths 64. In one fabrication methodology, circuit patterns are formed in layers of unfired tape (referred to as green sheet layers) using a screen printing process. The green sheet layers are made of ceramic particles in a polymer binder. Alumina may be used for the particles, although other oxides or various glass/ceramic blends may be used. Each green sheet layer receives conductor lines and other metallization patterns as needed to form conductive paths 64. Such lines and patterns are formed with a refractory metal, such as tungsten, by screen printing on the corresponding green sheet layer. Thereafter, the green sheet layers are fired. Thus, conductive and non-conductive or insulative layers are formed in substrate 32. While substrate 32 is illustrated as including layers 33, it is, however, within the scope of the present invention for substrate 32 to be formed of a solid pressed ceramic material. As such, conductive paths are formed, for example, as thin-film metallized layers on the pressed ceramic material.

While conductive paths 64 are illustrated as terminating at first side 321 and second side 322 of substrate 32, it is, however, within the scope of the present invention for conductive paths 64 to terminate at other sides of substrate 32. In addition, one or more conductive paths 64 may branch from and/or lead to one or more other conductive paths 64. Furthermore, one or more conductive paths 64 may begin and/or end within substrate 32. Conductive paths 64 may be formed as described, for example, in U.S. Pat. No. 6,428,145, entitled "Wide-Array Inkjet Printhead Assembly with Internal Electrical Routing System" assigned to the assignee of the present invention.

It is to be understood that FIGS. 5 and 6 are simplified schematic illustrations of one embodiment of carrier 30, including substrate 32 and substructure 34. The illustrative routing of fluid passages 323 and 343 through substrate 32 and substructure 34, respectively, and conductive paths 64 through substrate 32, for example, has been simplified for clarity of the invention. Although various features of carrier 30, such as fluid passages 323 and 343 and conductive paths 64, are schematically illustrated as being straight, it is understood that design constraints could make the actual geometry more complicated for a commercial embodiment of inkjet printhead assembly 12. Fluid passages 323 and 343, for example, may have more complicated geometries to allow multiple colorants of ink to be channeled through carrier 30. In addition, conductive paths 64 may have more complicated routing geometries through substrate 32 to avoid contact with fluid passages 323 and to allow for electrical connector geometries other than the illustrated I/O pins. It is understood that such alternatives are within the scope of the present invention.

Figure 7:
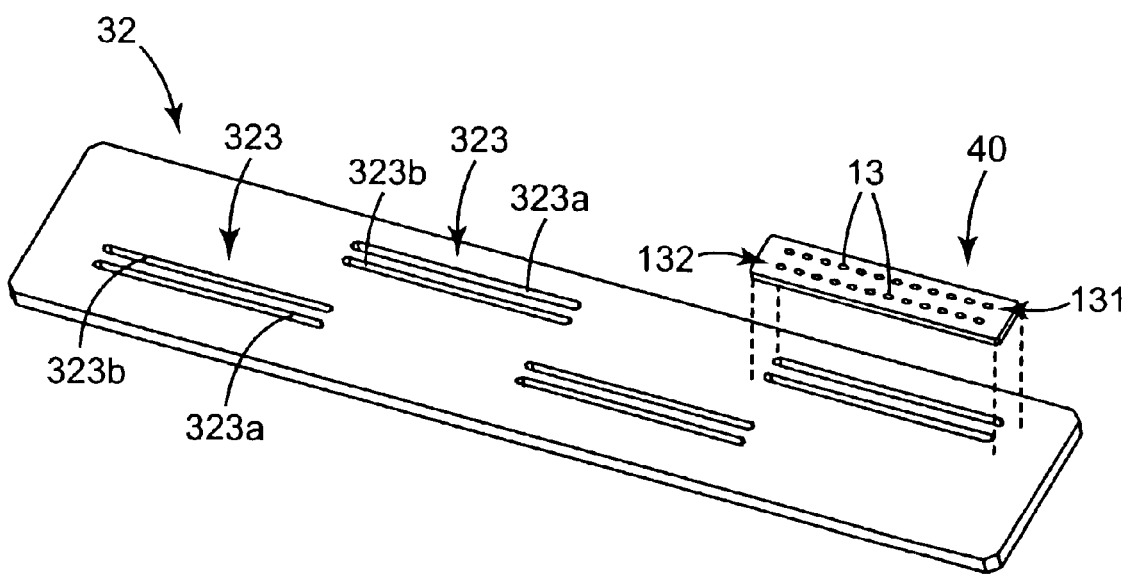
FIG. 7 is a top perspective view illustrating one embodiment of a substrate for an inkjet printhead assembly.

In one embodiment, as illustrated in FIG. 7, fluid passages 323 of substrate 32 each include a pair of fluid passages. More specifically, each fluid passage 323 includes a first fluid passage 323a and a second fluid passage 323b. Preferably, first fluid passage 323a and second fluid passage 323b are spaced from and oriented substantially parallel with each other. Printhead dies 40 are mounted on substrate 32 such that each printhead die 40 communicates with first fluid passage 323a and second fluid passage 323b of a respective fluid passage 323.

In one embodiment, also as illustrated in FIG. 7, nozzles 13 of printhead dies 40 are arranged to form a first nozzle set 131 and a second nozzle set 132. In one embodiment, first nozzle set 131 and second nozzle set 132 each include a column of orifices or nozzles such that first nozzle set 131 and second nozzle set 132 are spaced from and oriented substantially parallel from with each other. Each printhead die 40 is mounted on substrate 32 such that first nozzle set 131 communicates with first fluid passage 323a and second nozzle set 132 communicates with second fluid passage 323b of a respective fluid passage 323. As such, first fluid passage 323a of each pair of fluid passages 323 supplies fluid to first nozzle set 131 of a respective printhead die 40 and second fluid passage 323b of each pair of fluid passages 323 supplies fluid to second nozzle set 132 of a respective printhead die 40.

Figure 8:
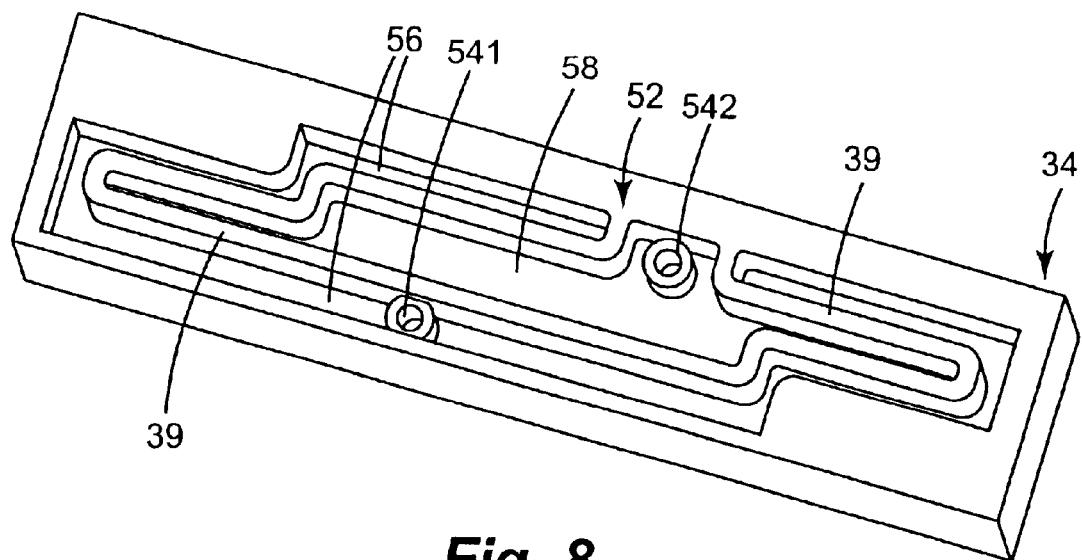
FIG. 8 is a top perspective view illustrating one embodiment of a substructure for an inkjet printhead assembly including one embodiment of a fluid manifold.
Figure 9:
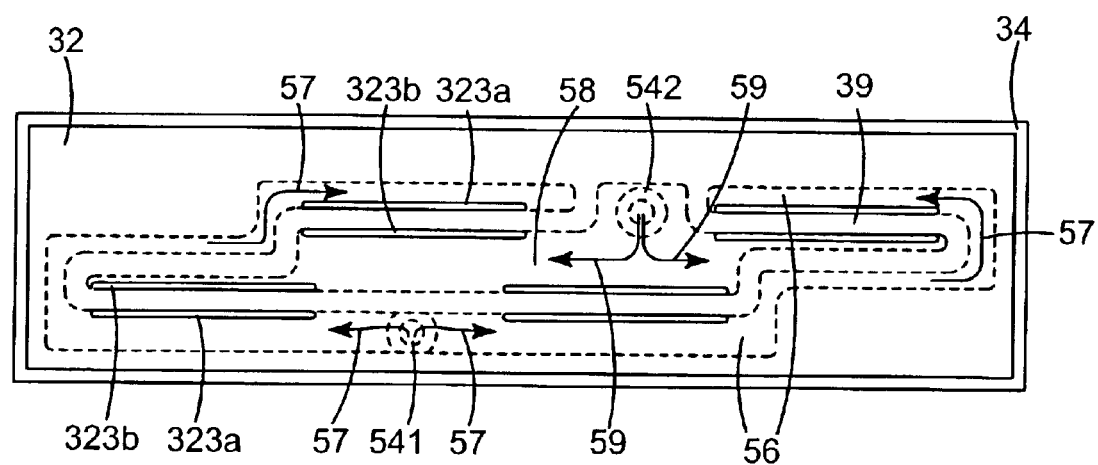
FIG. 9 is a top view illustrating the substrate of FIG. 7 supported by the substructure of FIG. 8.

In one embodiment, as illustrated in FIGS. 8 and 9, fluid manifold 52 of ink delivery system 50 is formed in substructure 34 of carrier 30. As such, fluid manifold 52 distributes ink or fluid to fluid passages 323 of substrate 32 and, therefore, printhead dies 40. In one embodiment, fluid manifold 52 includes a first chamber 56 and a second chamber 58. First chamber 56 and second chamber 58 are fluidically isolated from each other such that fluid in first chamber 56 does not mix with fluid in second chamber 58. First chamber 56 communicates with first fluid passage 323a of each pair of fluid passages 323 and second chamber 58 communicates with second fluid passage 323b of each pair of fluid passages 323.

In one embodiment, port 54 of ink delivery system 50 includes a first port 541 and a second port 542. First port 541 and second port 542 are formed in substructure 34 of carrier 30 such that first port 541 communicates with first chamber 56 of fluid manifold 52 and second port 542 communicates with second chamber 58 of fluid manifold 52. As such, first port 541 and first chamber 56 supply fluid to first fluid passage 323a of each pair of fluid passages 323, as illustrated by arrows 57, and second port 542 and second chamber 58 supply fluid to second fluid passage 323b of each pair of fluid passages 323, as illustrated by arrows 59.

In one embodiment, as illustrated in FIGS. 8 and 9, second chamber 58 has an elongated substantially S-shape and first chamber 56 substantially surrounds second chamber 58. As such, first chamber 56 substantially surrounds the S-shape of second chamber 58. An inner wall 39 of substructure 34 separates fluid manifold 52 into first chamber 56 and second chamber 58. While first chamber 56 is illustrated as surrounding less than all of second chamber 58, it is within the scope of the present invention for first chamber 56 to completely surround second chamber 58. In addition, a location of first port 541 and/or second port 542 may vary.

With first chamber 56 substantially surrounding second chamber 58, first fluid passage 323a includes the outer fluid passage of each pair of fluid passages 323 and second fluid passage 323b includes the inner fluid passage of each pair of fluid passages 323. As such, first fluid passage 323a of each pair of fluid passages 323 communicates with first chamber 56 of fluid manifold 52 and second fluid passage 323b of each pair of fluid passages 323 communicates with second chamber 58 of fluid manifold 52. First nozzle set 131 of each printhead die 40, therefore, includes the outer column of orifices or nozzles 13 and second nozzle set 132 of each printhead die 40 includes the inner column of orifices or nozzles 13.

Figure 10:
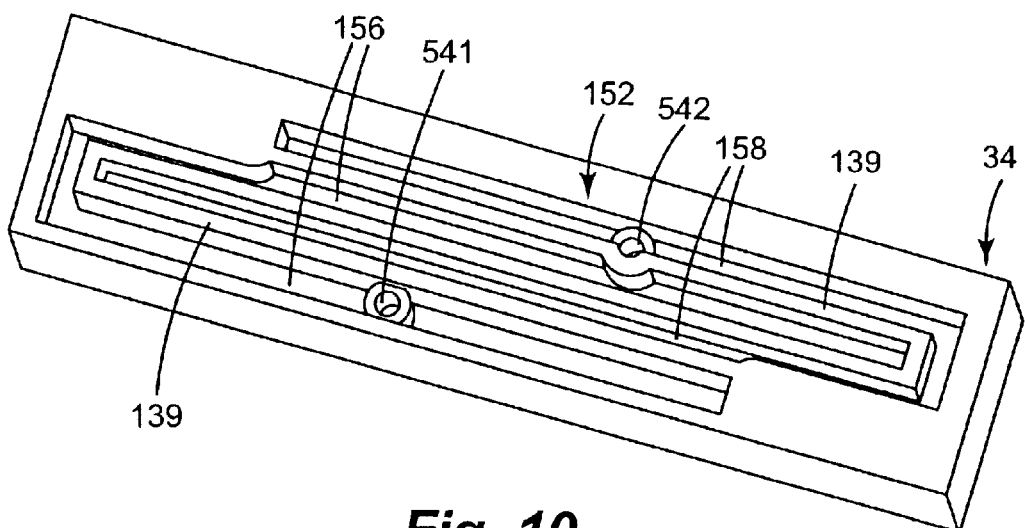
FIG. 10 is a top perspective view illustrating one embodiment of a substructure for an inkjet printhead assembly including another embodiment of a fluid manifold.
Figure 11:
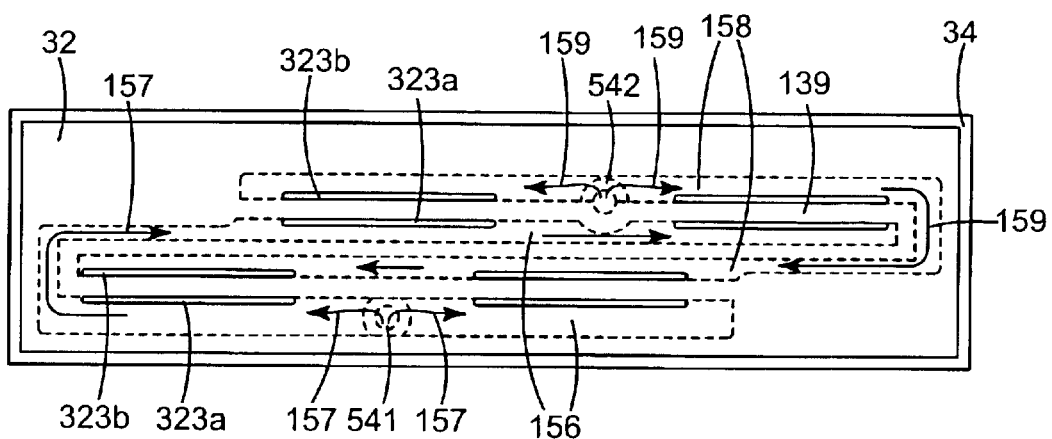
FIG. 11 is a top view illustrating the substrate of FIG. 7 supported by the substructure of FIG. 10.

FIGS. 10 and 11 illustrate another embodiment of a fluid manifold formed in substructure 34 of carrier 30. Fluid manifold 152, similar to fluid manifold 52, includes a first chamber 156 and a second chamber 158. As such, first chamber 156 communicates with first fluid passage 323a of each pair of fluid passages 323 and second chamber 158 communicates with second fluid passage 323b of each pair of fluid passages 323. In addition, first port 541 communicates with first chamber 156 of fluid manifold 152 and second port 542 communicates with second chamber 158 of fluid manifold 152. As such, first port 541 and first chamber 156 supply fluid to first fluid passage 323a of each pair of fluid passages 323, as illustrated by arrows 157, and second port 542 and second chamber 158 supply fluid to second fluid passage 323b of each pair of fluid passages 323, as illustrated by arrows 159.

In one embodiment, as illustrated in FIGS. 10 and 11, first chamber 156 and second chamber 158 are interleaved and each have a substantially U-shape such that the U-shape of second chamber 158 is oriented opposite the U-shape of first chamber 156. As such, one leg of the U-shape of first chamber 156 extends along one side of substructure 34 and one leg of the U-shape of second chamber 158 extends along an opposite side of substructure 34. An inner wall 139 of substructure 34 separates fluid manifold 152 into first chamber 156 and second chamber 158. In one embodiment, inner wall 139 has an elongated substantially S-shape.

With first chamber 156 and second chamber 158 interleaved, first fluid passage 323a includes the fluid passage of each pair of fluid passages 323 which is closest to one side of substructure 34 and second fluid passage 323b includes the fluid passage of each pair of fluid passage 323 which is closest to an opposite side of substructure 34. As such, first fluid passage 323a of each pair of fluid passages 323 communicates with first chamber 156 of fluid manifold 152 and second fluid passage 323b of each pair of fluid passages 323 communicates with second chamber 158 of fluid manifold 152. First nozzle set 131 of each printhead die 40, therefore, includes the column of orifices or nozzles 13 which is closest to one side of substructure 34 and second nozzle set 132 of each printhead die 40 includes the column of orifices or nozzles 13 which is closest to an opposite side of substructure 34.

Figure 12:
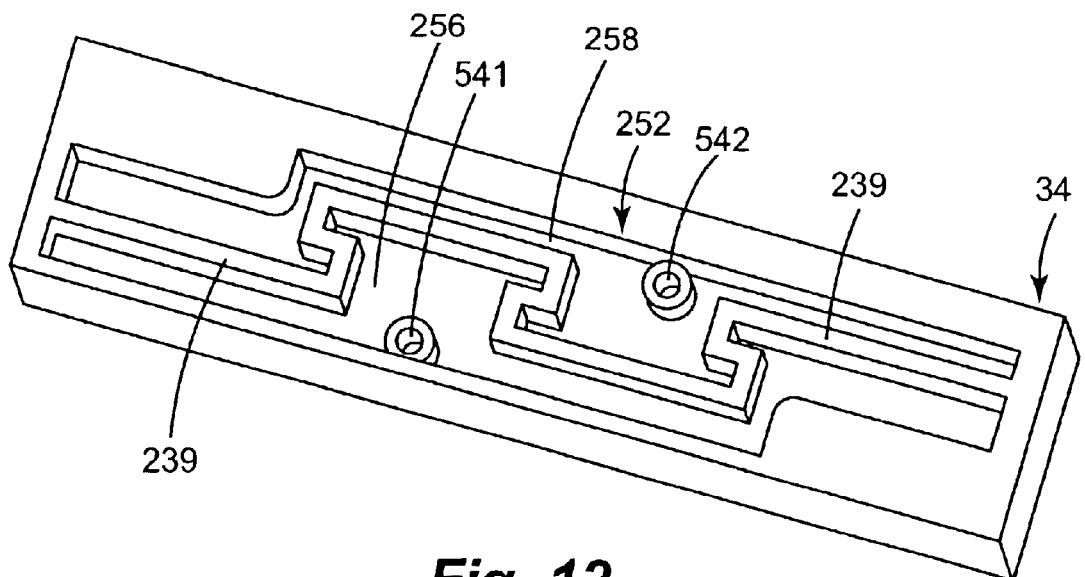
FIG. 12 is a top perspective view illustrating one embodiment of a substructure for an inkjet printhead assembly including another embodiment of a fluid manifold.
Figure 13:
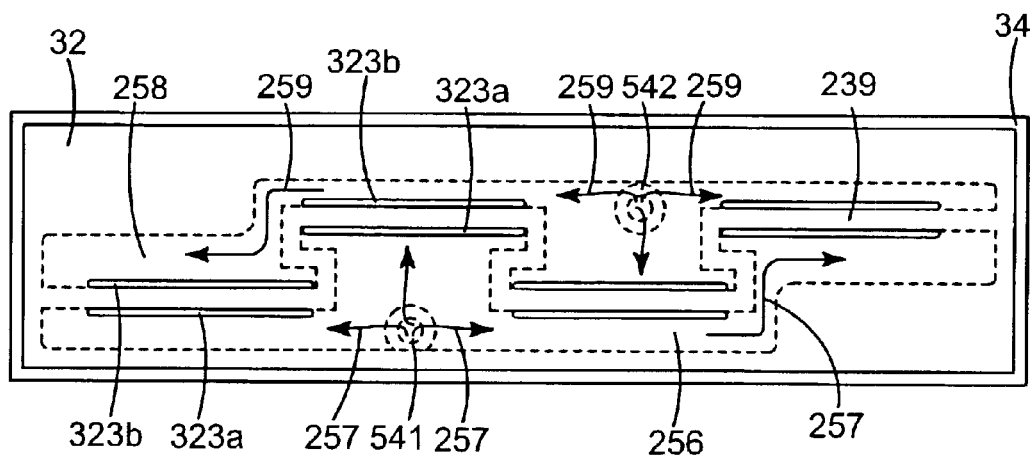
FIG. 13 is a top view illustrating the substrate of FIG. 7 supported by the substructure of FIG. 12.

FIGS. 12 and 13 illustrate another embodiment of a fluid manifold formed in substructure 34 of carrier 30. Fluid manifold 252, similar to fluid manifolds 52 and 152, includes a first chamber 256 and a second chamber 258. As such, first chamber 256 communicates with first fluid passage 323a of each pair of fluid passages 323 and second chamber 258 communicates with second fluid passage 323b of each pair of fluid passages 323. In addition, first port 541 communicates with first chamber 256 of fluid manifold 252 and second port 542 communicates with second chamber 258 of fluid manifold 252. As such, first port 541 and first chamber 256 supply fluid to first fluid passage 323a of each pair of fluid passages 323, as illustrated by arrows 257, and second port 542 and second chamber 258 supply fluid to second fluid passage 323b of each pair of fluid passages 323, as illustrated by arrows 259.

In one embodiment, as illustrated in FIGS. 12 and 13, first chamber 256 extends along one side of substructure 34 and second chamber 258 extends along an opposite side of substructure 34. More specifically, first chamber 256 is substantially confined to one side of substructure 34 and second chamber 258 is substantially confined to the opposite side of substructure 34. An inner wall 239 of substructure 34 separates fluid manifold 252 into first chamber 256 and second chamber 258. In one embodiment, inner wall 239 is shaped such that first chamber 256 and second chamber 258 each include at least one substantially T-shaped portion.

With first chamber 256 formed along one side of substructure 34 and second chamber 258 formed along an opposite side of substructure 34, first fluid passage 323a includes the fluid passage of each pair of fluid passages 323 which is closest to one side of substructure 34 and second fluid passage 323b includes the fluid passage of each pair of fluid passages 323 which is closest to an opposite side of substructure 34. As such, first fluid passage 323a of each pair of fluid passages 323 communicates with first chamber 256 of fluid manifold 252 and second fluid passage 323b of each pair of fluid passages 323 communicates with second chamber 258 of fluid manifold 252. First nozzle set 131 of each printhead die 40, therefore, includes the column of orifices or nozzles 13 which is closest to one side of substructure 34 and second nozzle set 132 of each printhead die 40 includes the column of orifices or nozzles 13 which is closest to an opposite side of substructure 34.

With fluid manifold 52 (including fluid manifolds 152 and 252) divided into first chamber 56 and second chamber 58 (including first chambers 156 and 256 and second chambers 158 and 258) and fluid passages 323 each including first fluid passage 323a and second fluid passage 323b, fluid manifold 52 can distribute differing fluids or inks to first nozzle set 131 and second nozzle set 132 of each printhead die 40 (FIG. 7). More specifically, first port 541 and first chamber 56 can supply a first fluid or ink to first fluid passage 323a of each pair of fluid passages 323 and, therefore, first nozzle set 131 of each printhead die 40, and second port 542 and second chamber 58 can supply a second fluid or ink to second fluid passage 323b of each pair of fluid passages 323 and, therefore, second nozzle set 132 of each printhead die 40. The differing fluids or inks may include, for example, inks of differing colors.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A printhead assembly, comprising:
   a carrier including a substructure having a fluid manifold defined therein and a substrate supported by the substructure, the fluid manifold including a first chamber and a second chamber; and
   a plurality of printhead dies each mounted on the substrate of the carrier and including a first nozzle set and a second nozzle set, wherein the first nozzle set of each of the printhead dies communicates with the first chamber of the fluid manifold and the second nozzle set of each of the printhead dies communicates with the second chamber of the fluid manifold.

2. The printhead assembly of claim 1, wherein the second chamber is fluidically isolated from the first chamber.

3. The printhead assembly of claim 1, wherein the carrier includes a first port communicating with the first chamber of the fluid manifold and a second port communicating with the second chamber of the fluid manifold.

4. The printhead assembly of claim 3, wherein the first port and the first chamber of the fluid manifold are adapted to supply a first fluid to the first nozzle set of each of the printhead dies, and the second port and the second chamber of the fluid manifold are adapted to supply a second fluid to the second nozzle set of each of the printhead dies.

5. The printhead assembly of claim 1, wherein the first chamber of the fluid manifold substantially surrounds the second chamber of the fluid manifold.

6. The printhead assembly of claim 5, wherein the second chamber of the fluid manifold is substantially S-shaped.

7. The printhead assembly of claim 1, wherein the first chamber of the fluid manifold and the second chamber of the fluid manifold are interleaved.

8. The printhead assembly of claim 7, wherein the first chamber of the fluid manifold and the second chamber of the fluid manifold are substantially U-shaped.

9. The printhead assembly of claim 1, wherein the first chamber of the fluid manifold extends along a first side of the carrier and the second chamber of the fluid manifold extends along a second side of the carrier opposite the first side thereof.

10. The printhead assembly of claim 9, wherein the first chamber of the fluid manifold and the second chamber of the fluid manifold are substantially U-shaped.

11. The printhead assembly of claim 9, wherein the first chamber of the fluid manifold and the second chamber at the fluid manifold each include at least one substantially T-shaped portion.

12. The printhead assembly of claim 1, wherein the first nozzle set and the second nozzle set of each of the printhead dies each include, a column of nozzles, and wherein the first nozzle set and die second nozzle set of each of the printhead dies are substantially parallel.

13. The printhead assembly of claim 1, wherein the substrate is a multi-layer substrate.

14. The printhead assembly of claim 13, wherein die substructure is formed of at least one of plastic and metal, and the multi-layered substrate is formed of a ceramic material.

15. The printhead assembly of claim 13, wherein the substructure is a single layer.

16. The printhead assembly of claim 1, wherein the substrate has a first plurality of fluid passages and a second plurality of fluid passages defined therein, wherein the first nozzle set of each of the printhead dies communicates with the first chamber of the fluid manifold via the first plurality of fluid passages and the second nozzle set of each of the printhead dies communicates with the second chamber of the fluid manifold via the second plurality of fluid passages.

17. A carrier adapted to receive a plurality of printhead dies, the carrier comprising:
 a substrate adapted to support the printhead dies and having a first plurality of fluid passages and a second plurality of fluid passages defined therein; and
 a substructure supporting the substrate and having a fluid manifold defined therein, the fluid manifold including a first chamber communicating with each of the first plurality of fluid passages and a second chamber communicating with each of the second plurality of fluid passages.

18. The carrier of claim 17, wherein each of the first plurality of fluid passages are paired with a respective one of the second plurality of fluid passages, and wherein each of the first plurality of fluid passages and the respective one of the second plurality of fluid passages are substantially parallel.

19. The carrier of claim 17, wherein each of the printhead dies are adapted to communicate with one of the first plurality of fluid passages and one of the second plurality of fluid passages.

20. The carrier of claim 17, wherein the second chamber of the fluid manifold is fluidically isolated from the first chamber of the fluid manifold.

21. The carrier of claim 17, wherein the substructure includes a first port communicating with the first chamber of the fluid manifold and a second port communicating with the second chamber of the fluid manifold.

22. The carrier of claim 21, wherein the first port and the first chamber of the fluid manifold are adapted to supply a first fluid to the first plurality of fluid passages, and the second port and the second chamber of the fluid manifold are adapted to supply a second fluid to the second plurality of fluid passages.

23. The carrier of claim 17, wherein the first chamber of the fluid manifold substantially surrounds the second chamber of the fluid manifold.

24. The carrier of claim 23, wherein the second chamber of the fluid manifold is substantially S-shaped.

25. The carrier of claim 17, wherein the first chamber of the fluid manifold and the second chamber of the fluid manifold are interleaved.

26. The carrier of claim 25, wherein the first chamber of the fluid manifold and the second chamber of the fluid manifold are substantially U-shaped.

27. The carrier of claim 17, wherein the first chamber of the fluid manifold extends along a first side of the carrier and the second chamber of the fluid manifold extends along a second side of the carrier opposite the first side thereof.

28. The carrier of claim 27, wherein the first chamber of the fluid manifold and the second chamber of the fluid manifold are substantially U-shaped.

29. The carrier of claim 27, wherein the first chamber of the fluid manifold and the second chamber of the fluid manifold each include at least one substantially T-shaped portion.

30. The carrier of claim 17, wherein each of the printhead dies include a first nozzle set and a second nozzle set, wherein the first nozzle set of each of the printhead dies is adapted to communicate with the first chamber of the fluid manifold and the second nozzle set of each of the printhead dies is adapted to communicate with the second chamber of the fluid manifold.

31. The carrier of claim 17, wherein the substrate is formed of a multi-layered ceramic material and the substructure is formed of at least one of plastic and metal.

32. The carrier of claim 17, wherein the substrate includes a plurality of layers and the substructure is a single layer.

33. A method of forming a printhead assembly, the method comprising:
 forming a fluid manifold in a substructure, including defining a first chamber and a second chamber of the fluid manifold; and
 mounting a plurality of printhead dies on a substrate supported by the substructure, including communicating a first nozzle set of each of the printhead dies with the first chamber of the fluid manifold and communicating a second nozzle set of each of the printhead dies with the second chamber of the fluid manifold.

34. The method of claim 33, wherein forming the fluid manifold includes fluidically isolating the second chamber of the fluid manifold from the first chamber of the fluid manifold.

35. The method of claim 33, wherein forming the fluid manifold includes communicating a first port of the substructure with the first chamber of the fluid manifold and communicating a second port of the substructure with the second chamber of the fluid manifold.

36. The method of claim 33, wherein defining the first chamber and the second chamber of the fluid manifold includes substantially surrounding the second chamber with the first chamber.

37. The method of claim 33, wherein defining the first chamber and the second chamber of the fluid manifold includes interleaving the first chamber and the second chamber.

38. The method of claim 33, wherein defining the first chamber and the second chamber of the fluid manifold includes providing the first chamber along a first side of the substructure and providing the second chamber along a second side of the substructure opposite the first side thereof.

39. The method of claim 38, wherein providing the first chamber along the first side of the substructure and providing the second chamber along the second side of the substructure includes substantially confining the first chamber to the first side of the substructure and substantially confining the second chamber to the second side of the substructure.

40. The method of claim 33, wherein the first nozzle set and the second nozzle set of each of the printhead dies each include a column of nozzles, and wherein the first nozzle set and the second nozzle set of each of the printhead dies are substantially parallel.

41. The method of claim 33, wherein the substrate is a multi-layered substrate.

42. The method of claim 41, wherein the substructure is a single layer.

43. The method of claim 33, wherein communicating the first nozzle set of each of the printhead dies with the first chamber of the fluid manifold includes communicating the first nozzle set of each of the printhead dies with the first chamber via a first plurality of fluid passages of the substrate, and wherein communicating the second nozzle set of each of the printhead dies with the second chamber of the fluid manifold includes communicating the second nozzle set of each of the printhead dies with the second chamber via a second plurality of fluid passages of the substrate.

44. A method of supplying a first fluid and a second fluid to a plurality of printhead dies each mounted on a substrate supported by a substructure, the method comprising:

communicating a fluid manifold of the substructure with the first fluid and the second fluid, including communicating a first chamber of the fluid manifold with the first fluid and a second chamber of the fluid manifold with the second fluid; and distributing the first fluid to a first nozzle set of each of the printhead dies via the first chamber and the second fluid to a second nozzle set of each of the printhead dies via the second chamber.

45. The method of claim 44, wherein communicating the first chamber of the fluid manifold with the first fluid and the second chamber of the fluid manifold with the second fluid includes fluidically isolating the second chamber from the first chamber.

46. The method of claim 44, wherein communicating the first chamber of the fluid manifold with the first fluid and the second chamber of the fluid manifold with the second fluid includes communicating a first port of the substructure with the first chamber and a second port of the substructure with the second chamber.

47. The method of claim 44, wherein distributing the first fluid to the first nozzle set and the second fluid to second nozzle set includes distributing the first fluid to a first column of nozzles of each of the printhead dies and the second fluid to a second column of nozzles of each of the printhead dies, wherein the first column of nozzles and the second column of nozzles of each of the printhead dies are substantially parallel.

48. The method of claim 44, wherein the substructure is a single-layer substructure and the substrate is a multi-layered substrate.

49. The method of claim 44, wherein distributing the first fluid to the first nozzle set of each of the printhead dies and the second fluid to the second nozzle set of each of the printhead dies includes distributing the first fluid to the first nozzle set of each of the printhead dies through a first plurality of fluid passages of the substrate and distributing the second fluid to the second nozzle set of each of the printhead dies through a second plurality of fluid passages of the substrate.

* * * * *

UNITED STATES PATENT AND TRADEMARK OFFICE
CERTIFICATE OF CORRECTION

PATENT NO. : 6,789,878 B2
DATED : September 14, 2004
INVENTOR(S) : Scheffelin et al.

It is certified that error appears in the above-identified patent and that said Letters Patent is hereby corrected as shown below:

Column 10,
Line 58, delete "die" and insert therefor -- the --.
Line 62, delete "die" and insert therefor -- the --.

Signed and Sealed this

Twelfth Day of April, 2005

JON W. DUDAS
*Director of the United States Patent and Trademark Office*